(12) United States Patent
Nensel

(10) Patent No.: US 11,234,344 B2
(45) Date of Patent: Jan. 25, 2022

(54) HEAT TRANSFER APPARATUS FOR A MOBILE DEVICE

(71) Applicant: MOTOROLA MOBILITY LLC, Chicago, IL (US)

(72) Inventor: Phillip R. Nensel, Wauconda, IL (US)

(73) Assignee: Motorola Mobility LLC, Chicago, IL (US)

( * ) Notice: Subject to any disclaimer, the term of this patent is extended or adjusted under 35 U.S.C. 154(b) by 93 days.

(21) Appl. No.: 16/397,056

(22) Filed: Apr. 29, 2019

(65) Prior Publication Data
US 2020/0344913 A1 Oct. 29, 2020

(51) Int. Cl.
*H05K 7/20* (2006.01)
*G06F 1/20* (2006.01)

(52) U.S. Cl.
CPC ..... *H05K 7/20336* (2013.01); *H05K 7/20327* (2013.01); *G06F 1/203* (2013.01); *G06F 2200/201* (2013.01)

(58) Field of Classification Search
CPC .......... H05K 7/20254; H05K 7/20327; H05K 7/20336; H05K 7/2039; H05K 7/20436; H05K 7/20509; G06F 1/203; G06F 2200/201
See application file for complete search history.

(56) References Cited

U.S. PATENT DOCUMENTS

| | | | |
|---|---|---|---|
| 2006/0144574 A1* | 7/2006 | Rosenfeld | F28F 19/06 165/104.33 |
| 2009/0041466 A1* | 2/2009 | Patel | H04B 10/803 398/130 |
| 2011/0232877 A1* | 9/2011 | Meyer, IV | F28D 15/0266 165/104.26 |
| 2015/0173243 A1* | 6/2015 | Chauhan | H05K 7/20336 165/104.26 |
| 2017/0094837 A1* | 3/2017 | Joshi | H05K 7/20345 |
| 2019/0259632 A1* | 8/2019 | Isaacs | H01L 23/473 |
| 2019/0339021 A1* | 11/2019 | Tseng | F28D 15/043 |
| 2019/0373768 A1* | 12/2019 | Papoulis | H05K 7/20872 |
| 2020/0337181 A1* | 10/2020 | Tian | F28F 3/12 |

* cited by examiner

*Primary Examiner* — Jacob R Crum
(74) *Attorney, Agent, or Firm* — Isidore PLLC

(57) ABSTRACT

A heat transfer device, a mobile device, and a manufacturing method for manufacturing a heat transfer device. The heat transfer device includes a first plate having a first inner surface and a first outer surface. A second plate has a second inner surface and a second outer surface. The first plate and the second plate are at least partially bonded such that an internal reservoir is defined between the first inner surface and the second inner surface. A thermal transfer fluid is contained within the internal reservoir and is in fluid contact with both the first inner surface and the second inner surface. A first wing extends from the first plate. The first wing is adapted to be coupled to a first electronic component that requires cooling. The first wing provides heat transfer from the first electronic component to the thermal transfer fluid via the first plate.

19 Claims, 7 Drawing Sheets

HEAT TRANSFER APPARATUS FOR A MOBILE DEVICE

BACKGROUND

1. Technical Field

The present disclosure generally relates to electronic devices and in particular to a heat transfer apparatus for a mobile device.

2. Description of the Related Art

Mobile electronic devices, such as cell phones, generate heat during operation. The amounts of heat generated by the components of the mobile device increase as the components perform at a higher rate. Various solutions to cool electronic components are known. For example, heat sinks and heat pipes have been used to remove heat from electronic components. Unfortunately, heat sinks and heat pipes take up significant space within a mobile device. Further, heat pipes are constrained in their ability to be formed into non-linear shapes because of the liquid contained within the heat pipe.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
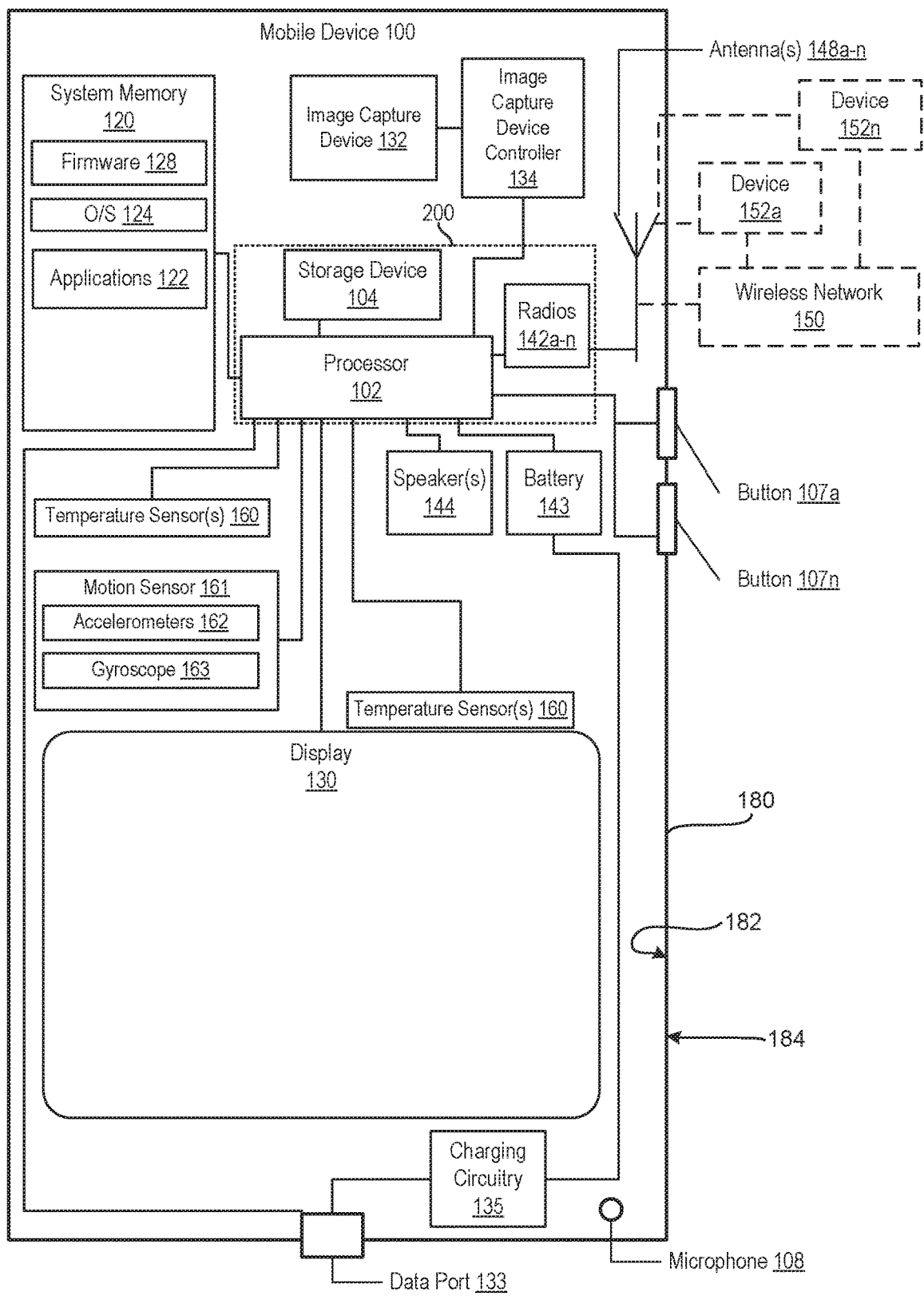
FIG. 1 depicts an example mobile device within which various aspects of the disclosure can be implemented, according to one or more embodiments.

The illustrative embodiments provide a heat transfer device, a mobile device configured with a heat transfer device, and a method for manufacturing the heat transfer device. The heat transfer device includes a first plate having a first inner surface and a first outer surface. The heat transfer device also includes a second plate that has a second inner surface and a second outer surface. The first plate and the second plate are spaced apart from and opposed to each other and are at least partially bonded such that an internal reservoir is defined between the first inner surface and the second inner surface. A thermal transfer fluid is contained within the internal reservoir and is in fluid contact with both the first inner surface and the second inner surface. A first wing extends from the first plate. The first wing is adapted to be coupled to a first electronic component that requires cooling. The first wing provides heat transfer from the first electronic component to the thermal transfer fluid via the first plate. The thermal transfer fluid moves within the internal reservoir dissipating transferred heat through the first and second plates toward the exterior of the mobile device.

According to another embodiment, a mobile device includes at least one electronic component that requires cooling and a heat transfer device coupled to the at least one electronic component. The heat transfer device includes a first plate having a first inner surface and a first outer surface and a second plate having a second inner surface and a second outer surface. The first plate and the second plate are spaced apart from and opposed to each other and at least partially bonded such that an internal reservoir is defined between the first inner surface and the second inner surface. A thermal transfer fluid is contained within the internal reservoir and in fluid contact with both the first inner surface and the second inner surface. A first wing extends from the first plate. The first wing is adapted to be coupled to a first electronic component that requires cooling. The first wing provides heat transfer from the first electronic component to the thermal transfer fluid via the first plate. The thermal transfer fluid moves within the internal reservoir dissipating transferred heat through the first and second plates toward the exterior of the mobile device.

According to an additional embodiment, a method for manufacturing a heat transfer device is performed by a programmed computer device having a processor. The processor executes a computer program product. The computer program product includes a non-transitory computer readable storage device and program code on the non-transitory computer readable storage device that when executed by the processor configures the computer device to manufacture a heat transfer device by: positioning a wick on a first portion of a first plate that has a first wing extending from the first plate and a first aperture. The method further includes positioning a second plate opposed to the first plate and bonding opposed sections of the first and second plates to define an internal reservoir there-between in which the wick is disposed. The method further includes filling the internal reservoir with a thermal transfer fluid and sealing the first aperture in the first plate.

The above contains simplifications, generalizations and omissions of detail and is not intended as a comprehensive description of the claimed subject matter but, rather, is intended to provide a brief overview of some of the functionality associated therewith. Other systems, methods, functionality, features, and advantages of the claimed subject matter will be or will become apparent to one with skill in the art upon examination of the figures and the remaining detailed written description. The above as well as additional objectives, features, and advantages of the present disclosure will become apparent in the following detailed description.

In the following description, specific example embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from the general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various aspects are described which may be aspects for some embodiments but not other embodiments.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be provided its broadest interpretation given the context in which that term is utilized.

Those of ordinary skill in the art will appreciate that the hardware components and basic configuration depicted in the following figures may vary. For example, the illustrative components within mobile device 100 are not intended to be exhaustive, but rather are representative to highlight components that can be utilized to implement the present disclosure. For example, other devices/components may be used in addition to, or in place of, the hardware depicted. The depicted example is not meant to imply architectural or other limitations with respect to the presently described embodiments and/or the general disclosure.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments.

FIG. 1 depicts an example mobile device 100 within which various aspects of the disclosure can be implemented, according to one or more embodiments. Examples of such mobile devices include, but are not limited to, a notebook computer, a mobile phone, a digital camera, and a tablet computer, etc. Mobile device 100 includes processor 102, which is communicatively coupled to storage device 104, system memory 120, display 130, and image capture device controller 134. Mobile device 100 is contained within a housing 180 that has an interior surface 182 and an exterior surface 184. Processor 102, system memory 120, display 130, and image capture device controller 134 are examples of electronic components of mobile device 100.

System memory 120 may be a combination of volatile and non-volatile memory, such as random access memory (RAM) and read-only memory (ROM). System memory 120 can store program code or similar data associated with firmware 128, an operating system 124 and applications 122. Processor 102 loads and executes program code stored in system memory 120. Examples of program code that may be loaded and executed by processor 102 include program code associated with applications 122. Display 130 can be one of a wide variety of display screens or devices, such as a liquid crystal display (LCD) and an organic light emitting diode (OLED).

In one embodiment, image capture device 132 is communicatively coupled to image capture device controller 134, which is communicatively coupled to processor 102.

Mobile device 100 can further include data port 133, charging circuitry 135, and battery 143. In one embodiment, display 130 can be a touch screen device that can receive user tactile/touch input. Mobile device 100 further includes a microphone 108, one or more speakers 144, and one or more input buttons 107a-n. Buttons 107a-n may provide controls for volume, and power and for controlling (or interacting with) image capture device 132. Mobile device 100 further includes radios 142a-n, which are coupled to antennas 148a-n. In this implementation, radios 142a-n and antennas 148a-n allow mobile device 100 to communicate wirelessly with other devices 152a-n via wireless network 150. Radios 142a-n can include various electronic components such as power amplifiers and filters.

Mobile device 100 further includes temperature sensors 160 and motion sensor(s) 161. Motion sensor(s) 161 can include one or more accelerometers 162 and gyroscope 163. Temperature sensors 160 can be located at several locations within mobile device 100. For example, one temperature sensor can be located adjacent processor 102, one temperature sensor can be located adjacent display 130, and one or more temperature sensors can be located adjacent to interior surfaces 182 of mobile device 100. In one embodiment, temperature sensors 160 can be used to estimate the exterior surface temperatures of exterior surface 184 at one or more locations on mobile device 100.

Mobile device 100 further includes a heat transfer device 200. Heat transfer device 200 is used to remove heat from electronic components within mobile device 100. Electronic components that require cooling during operation, such as processor 102 and storage device 104, can be attached to heat transfer device 200.

Figure 2A:
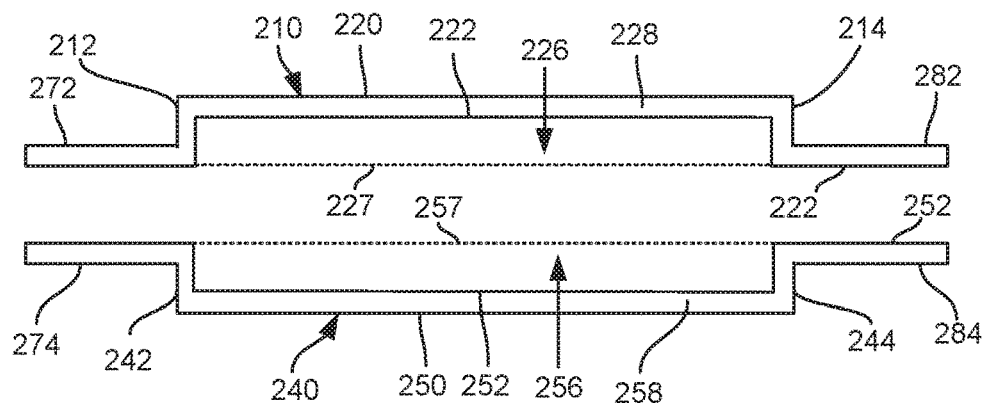
FIG. 2A is a side cross-sectional view of an upper plate and a lower plate of a heat transfer device according to one or more embodiments.

In the description of each of the following figures, reference is also made to specific components illustrated within the preceding figure(s). Referring to FIG. 2A, one embodiment of an upper plate 210 and a lower plate 240 are shown. Upper plate 210 and lower plate 240 appear generally planar or sheet shaped, but are designed to have an angled volumetric indentation along a middle portion of the plate. Upper plate 210 and lower plate 240 can be formed from thermally conductive materials such as aluminum, aluminum alloys, copper or copper alloys. Upper plate 210 and lower plate 240 can be formed by suitable methods such as stamping. In FIG. 2A, upper plate 210 and lower plate 240 are shown parallel and spaced apart prior to assembly of heat transfer device 200.

In the illustrative embodiment, upper plate 210 includes parallel and opposed sides 212 and 214. Upper plate 210 has a central body 228, outer surface 220, and inner surface 222. Upper plate 210 is formed with an upper cavity 226 adjacent to inner surface 222. Inner walls 227 surround upper cavity 226. Lower plate 240 similarly includes parallel and opposed sides 242 and 244. Lower plate 240 has a central body 258, outer surface 250, and inner surface 252. Lower plate 240 is formed with a lower cavity 256 adjacent to inner surface 252. Inner walls 257 surround lower cavity 256. In the view of FIG. 2A, the dashed lines of inner walls 227 and 257 indicate the back of the walls that surround upper cavity 226 and lower cavity 256. Upper plate 210 has a blade 272 that extends away from side 212 and a blade 282 that extends away from side 214. Similarly, lower plate 240 has a blade 274 that extends away from side 242 and a blade 284 that extends away from side 244.

Figure 2B:
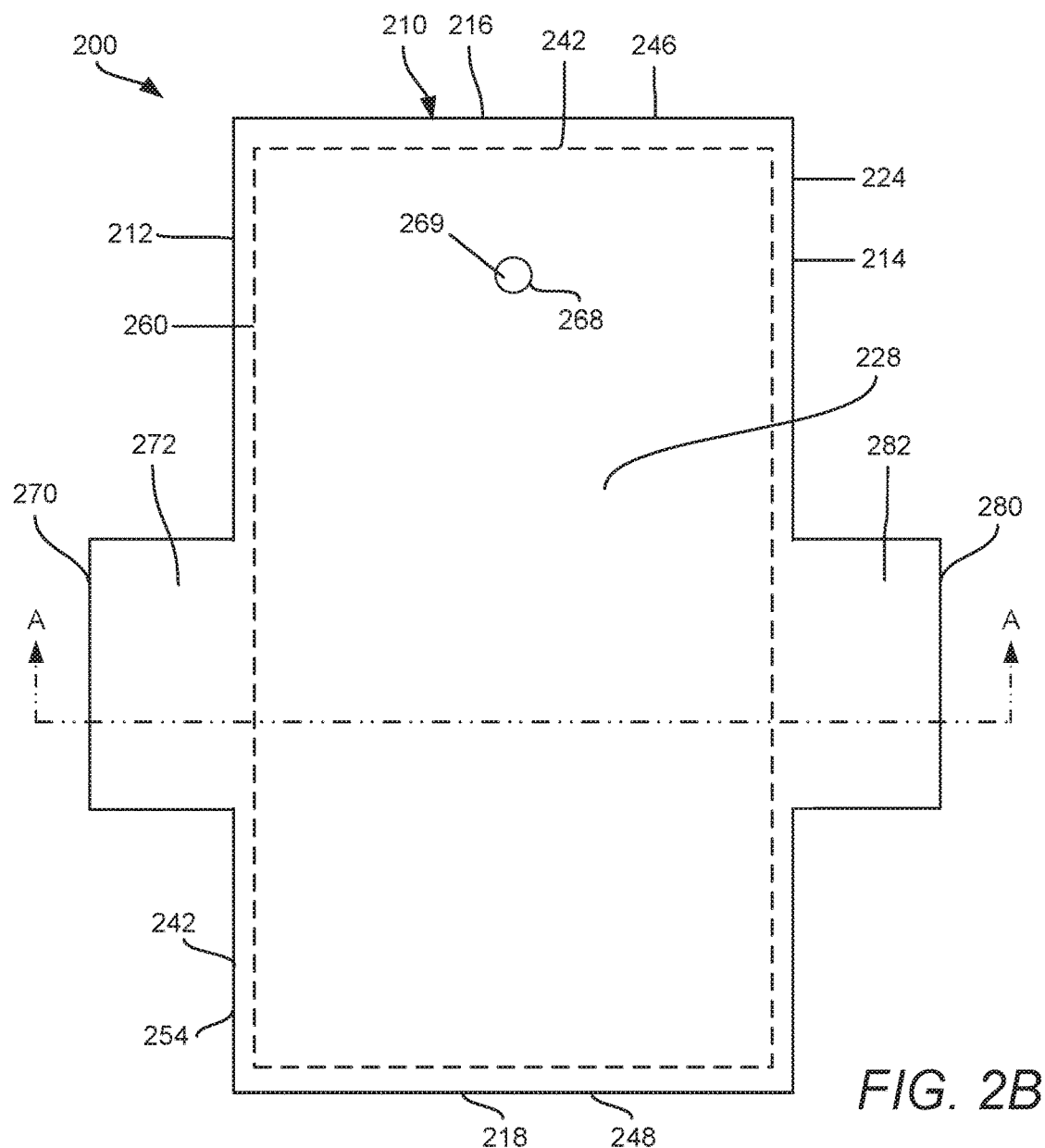
FIG. 2B is a top view of an assembled heat transfer device, according to one or more embodiments.
Figure 3A:
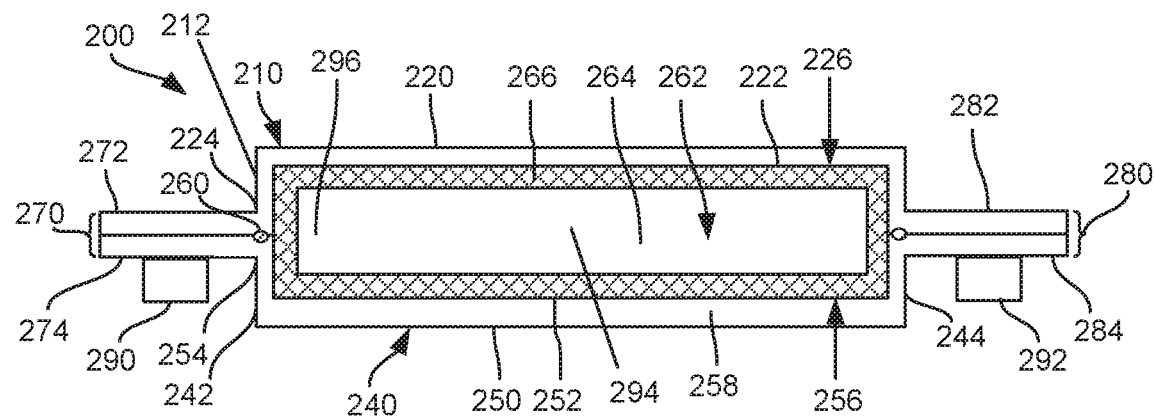
FIG. 3A is a cross-sectional view of the heat transfer device of FIG. 2B taken along section line AA of FIG. 2B, according to one or more embodiments.

FIG. 2B provides a top view of example heat transfer device 200 with the upper plate 210 visible and FIG. 3A provides a cross sectional view of one section of heat transfer device 200 taken along lines AA of FIG. 2B. With reference now to FIGS. 2B and 3A, heat transfer device 200 includes upper plate 210 and lower plate 240 that are bonded together along outer peripheral edges 224 and 254. The inner surface 222 of upper plate 210 faces the inner surface 252 of lower plate 240 such that upper cavity 226 and lower cavity 256 are adjacent and contiguous with each other. Upper plate 210 includes parallel and opposed sides 212 and 214 and parallel and opposed sides 216 and 218. Lower plate 240 similarly includes parallel and opposed sides 246 and 248. The upper plate and lower plate are shown as being generally rectangular in shape; However, it is appreciated that, in other embodiments, the actual shape of both the upper plate and lower plate can be a different shape than shown (e.g., circular versus squared edges, or non-parallel sides).

Upper plate 210 and lower plate 240 are positioned opposed to each other such that the inner surface 222 of upper plate 210 faces the inner surface 252 of lower plate 240. A seal 260 (which is more clearly shown in FIG. 3B) is formed between outer peripheral edges 224 and 254 and bonds upper plate 210 and lower plate 240. Seal 260 can be formed by various methods, such as welding, brazing, and using adhesives. The opposed positioning of upper cavity 226 next to inner surface 222 and lower cavity 256 next to inner surface 252 define an internal reservoir 262 therebetween. Internal reservoir 262 is filled with a thermal transfer fluid 264. Thermal transfer fluid 264 can be one of a variety of fluids, including water or ammonia. A wick 266 is positioned within internal reservoir 262, adjacent to inner surface 222 and inner surface 252. Wick 266 can be formed from sintered metal powder, screens, and wires. Wick 266 is at least partially porous.

Heat transfer device 200 further includes wings 270 and 280. Wings 270 and 280 extend away from opposite sides of heat transfer device 200. Upper plate 210 has a blade 272 that extends away from side 212 and lower plate 240 has a blade 274 that extends away from side 242. When heat transfer device 200 is assembled, blades 272 and 274 are parallel, adjacent and in contact with each other. Blades 272 and 274 are held together via seal 260 to form wing 270. Upper plate 210 further has a blade 282 that extends away from side 214 and lower plate 240 has a blade 284 that extends away from side 244. Blades 282 and 284 are parallel, adjacent and in contact with each other. Blades 282 and 284 are held together via seal 260 to form wing 280.

Electronic components (e.g., components 290 and 292) that require cooling during operation can be attached to heat transfer device 200. As further illustrated by the figures, electronic component 290 is mounted to wing 270 and electronic component 292 is mounted to wing 280. More specifically, electronic component 290 is mounted to the lower surface of blade 274 and electronic component 292 is mounted to the lower surface of blade 284. Electronic components 290 and 292 can be mounted to wings 270 and 280 using various methods, such as using conductive adhesives, brackets and retainers.

Heat transfer device 200 is a closed evaporator-condenser system that is sealed and lined with wick 266. A thermal transfer fluid 264, with substantial vapor pressure at the desired operating temperature of the heat transfer device, saturates the pores of the wick in a state of equilibrium between liquid and vapor. When heat is applied to wings 270 and 280, heat is conducted through the wings into the thermal transfer fluid within wick 266 and into the thermal transfer fluid adjacent region 296. The thermal transfer fluid heats up and evaporates. The vapor diffuses through the porous wick into internal reservoir 262. The vapor travels toward the center 294 of the internal reservoir. Condensation of the vapor occurs where the temperature within internal reservoir 262 is below the boiling point of the thermal transfer fluid. As the vapor condenses, the vapor releases the heat acquired during evaporation.

Heat transfer device 200 operates as a heat plate or heat pipe. During operation, when electronic component 290 is generating heat, heat will be conducted by wing 270 to upper and lower plates 210 and 240 and to thermal transfer fluid 264 within wick 266 and internal reservoir 262. A portion of thermal transfer fluid 264 located in region 296 toward sides 212 and 242 will evaporate into a vapor. As the thermal transfer fluid 264 evaporates into a vapor, the vapor acquires heat. The vapor diffuses through a portion of wick 266, into region 296 and along the length of plates 210 and 240 towards the center 294 of heat transfer device 200. At the center 294 of heat transfer device 200, the vapor condenses back to thermal transfer fluid 264. As the vapor condenses, the vapor releases the heat acquired during evaporation. The heat is dissipated via conduction through the metal of upper plate 210 and lower plate 240 into surrounding air. After condensing, the thermal transfer fluid 264 returns through wick 266 via capillary action back toward sides 212 and 242.

Figure 3B:
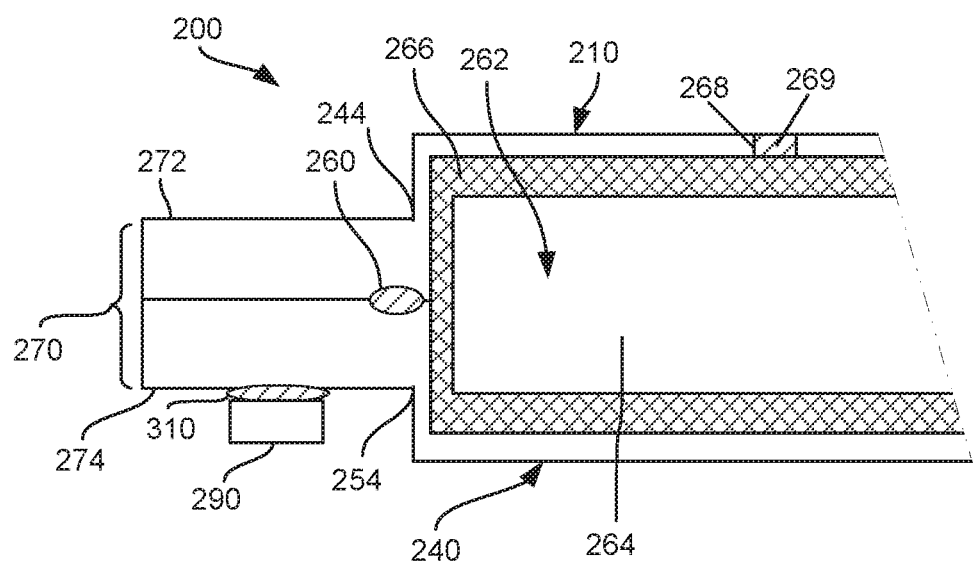
FIG. 3B is an enlarged view of a section of FIG. 3A illustrating details of a seal, according to one or more embodiments.

FIG. 3B illustrates an enlarged cross-sectional view of a portion of heat transfer device 200. Seal 260 is formed between the inner surface of outer peripheral edge 224 of upper plate 210 and the inner surface of outer peripheral edge 254 of lower plate 240. Seal 260 can be formed by various methods such as welding, brazing and using adhesives. Seal 260 can facilitate a vacuum being created within internal reservoir 262. Electronic component 290 is shown mounted to wing 270 via a thermal conductive adhesive 310. Thermal conductive adhesive 310 provides conduction of heat from electronic component 290 to wing 270. An aperture 268 extends through upper plate 210, providing access to internal reservoir 262. Aperture 268 is used to fill internal reservoir 262 with thermal transfer fluid 264 during manufacturing. Aperture 268 can be sealed with a plug 269 to retain thermal transfer fluid 264 within internal reservoir 262.

Figure 4A:
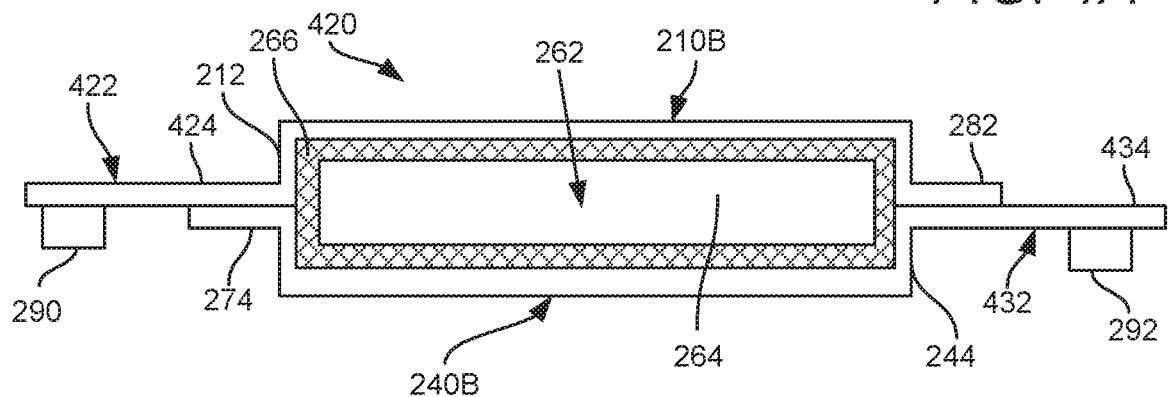
FIG. 4A is a second cross-sectional view of an alternate embodiment of the heat transfer device of FIG. 2B, according to one or more embodiments.

Referring to FIG. 4A, a cross-sectional view of another embodiment of a heat transfer device 420 is shown. Heat transfer device 420 is similar to heat transfer device 200 of FIGS. 2A and 2B except that wing 422 is formed by an extension of a single blade 424 from upper plate 210B and wing 432 is formed by an extension of a single blade 434 from lower plate 240B. Blade 424 extends away from side 212 of upper plate and blade 432 extends away from side 244 of lower plate. Electronic component 290 is mounted to a lower surface of wing 422 and electronic component 292 is mounted to a lower surface of wing 432. In one or more alternative embodiments, electronic component 290 can be mounted to an upper surface of wing 422 and/or electronic component 292 can be mounted to an upper surface of wing 432. Heat generated by electronic component 290 is conducted by wing 422 to thermal transfer fluid 264 within wick 266 where thermal transfer fluid 264 evaporates. The vapor then moves into internal reservoir 262 and condenses back to a fluid transferring heat to central portions of upper and lower plates 210B and 240B. Heat generated by electronic component 292 is conducted by wing 432 to thermal transfer fluid 264 within wick 266 where thermal transfer fluid 264 evaporates. The vapor then moves into internal reservoir 262 and condenses back to a fluid transferring heat to central portions of upper and lower plates 210B and 240B. The heat is dissipated via conduction through the metal of upper plate 210B and lower plate 240B into surrounding air. After condensing, the thermal transfer fluid 264 returns through wick 266 via capillary action back toward sides 212 and 242.

Figure 4B:
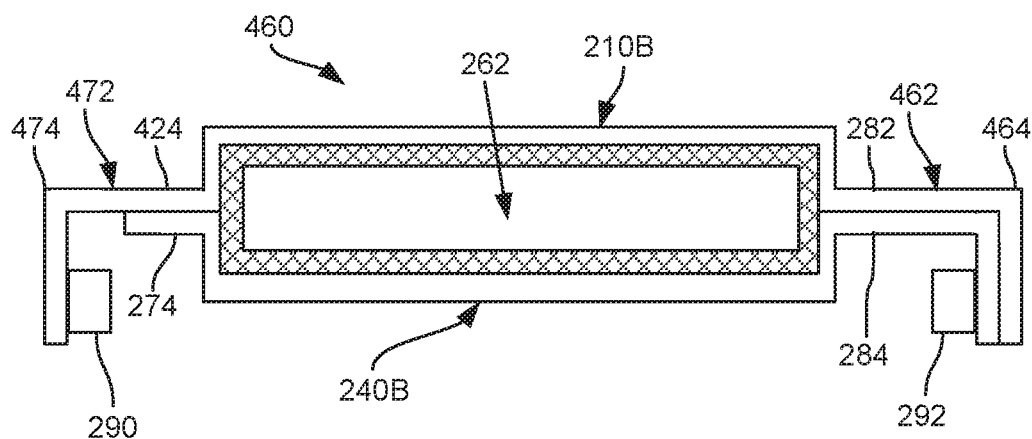
FIG. 4B is a third cross-sectional view of a second alternate embodiment of the heat transfer device of FIG. 2B, according to one or more embodiments.

With reference to FIG. 4B, a cross-sectional view of another embodiment of a heat transfer device 460 is shown. Heat transfer device 460 is similar to heat transfer device 420 of FIG. 4A. Heat transfer device 460 is different than heat transfer device 420 in that wing 462 has been formed or bent downward. Wing 462 has been bent downward at an angle relative to the plane of upper plate 210B and lower plate 240B. Wing 462 has a corner or bend 464 where the wing angles downward. Wing 462 can be formed by bending blades 282 and 284. While wing 462 is shown as extending from bend 464 at approximate 90-degree angle to upper plate 210B and lower plate 240B, bend 464 can be formed with various angles to upper plate 210B and lower plate 240B, in other embodiments.

Wing 472 has been bent downward at angle relative to the plane of upper plate 210B. Wing 472 has a corner or bend 474 where the wing angles downward. Wing 472 can be formed by bending blade 424. While wing 472 is shown having an approximate 90-degree angle to upper plate 210B, bend 474 can be formed with various angles. The bending of wings 462 and 472 allows for electronic components that are positioned in different three-dimensional orientations within mobile device 100 to be coupled to heat transfer device 460.

Figure 5:
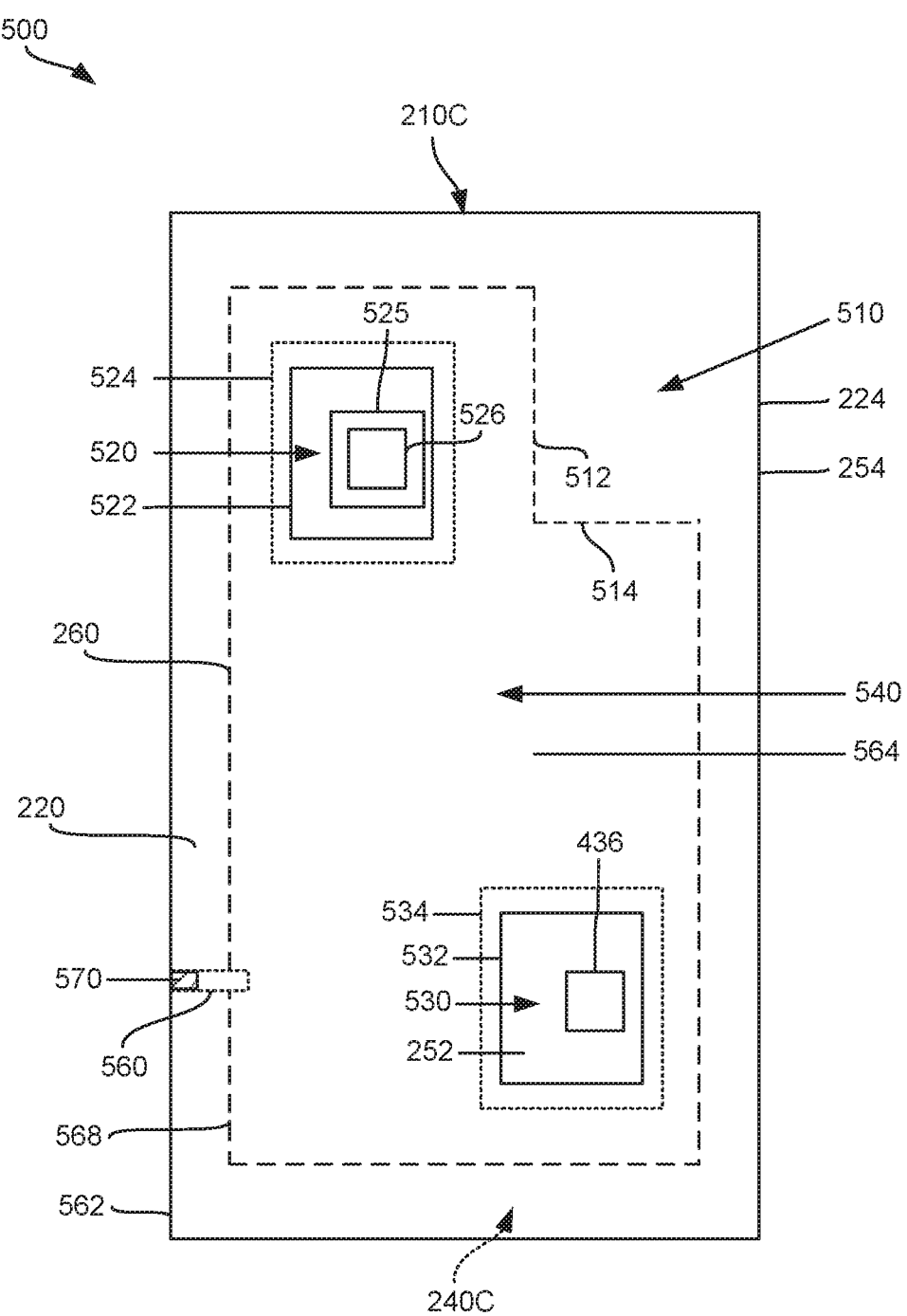
FIG. 5 is a top view of another embodiment of a heat transfer device, according to one or more embodiments.

Turning to FIG. 5, a top view of another embodiment of a heat transfer device 500 is shown. Heat transfer device 500 is similar to heat transfer device 200 of FIGS. 2A and 2B except that heat transfer device 500 omits wings 270 and 280 and includes an area 510 without an internal reservoir. Heat transfer device 500 also has an opening 520 and a recess 530. The area 510 without an internal reservoir is defined by outer peripheral edges 224, 254 (also shown in FIG. 3A) and seal portions 512, 514. Within area 510, the inner surface 222 (FIG. 2A) of upper plate 210 is adjacent to and in direct contact with inner surface 252 (FIG. 2A) of lower plate 240 (FIG. 2A). Area 510 does not have an internal reservoir and therefore there is no thermal transfer fluid located within area 510. Area 510 can be bent in various shapes to facilitate attachment to one or more electronic components.

Opening 520 extends entirely through upper plate 210C and lower plate 240C. Opening 520 is defined by walls 522 that surround opening 520. A seal ring 524 surrounds walls 522 and opening 520. Seal ring 524 seals internal reservoir 540 from opening 520. A printed circuit board (PCB) 525 can be mounted below heat transfer device 500. One or more electronic components 526 can be mounted to PCB 525 and extend upwardly above PCB 525. Electronic component 526 extends from the top surface of PCB 525 upwardly into opening 520. Opening 520 allows one or more electronic components 526 of increased height to extend into opening 520 and fit within the dimensions of opening 520.

Recess 530 extends into upper plate 210. Recess 530 is defined by walls 532 and the inner surface 252 of lower plate 240. A seal ring 534 surrounds walls 532 and recess 530. Seal ring 534 seals internal reservoir 540 from recess 530. Recess 530 allows one or more electronic components 536 of increased height to extend downwardly from above into recess 530 and fit within the dimensions of recess 530.

In one alternative embodiment, an aperture 560 extends from side 562 through upper plate 210C and past seal portion 568 into internal reservoir 540. Aperture 560 is used to fill internal reservoir 540 with thermal transfer fluid 564 during manufacturing. Aperture 560 can be sealed with a plug 570 to retain the thermal transfer fluid 564 within internal reservoir 540. In one embodiment, a syringe and needle can be used to fill internal reservoir 540 with thermal transfer fluid 564.

Figure 6:
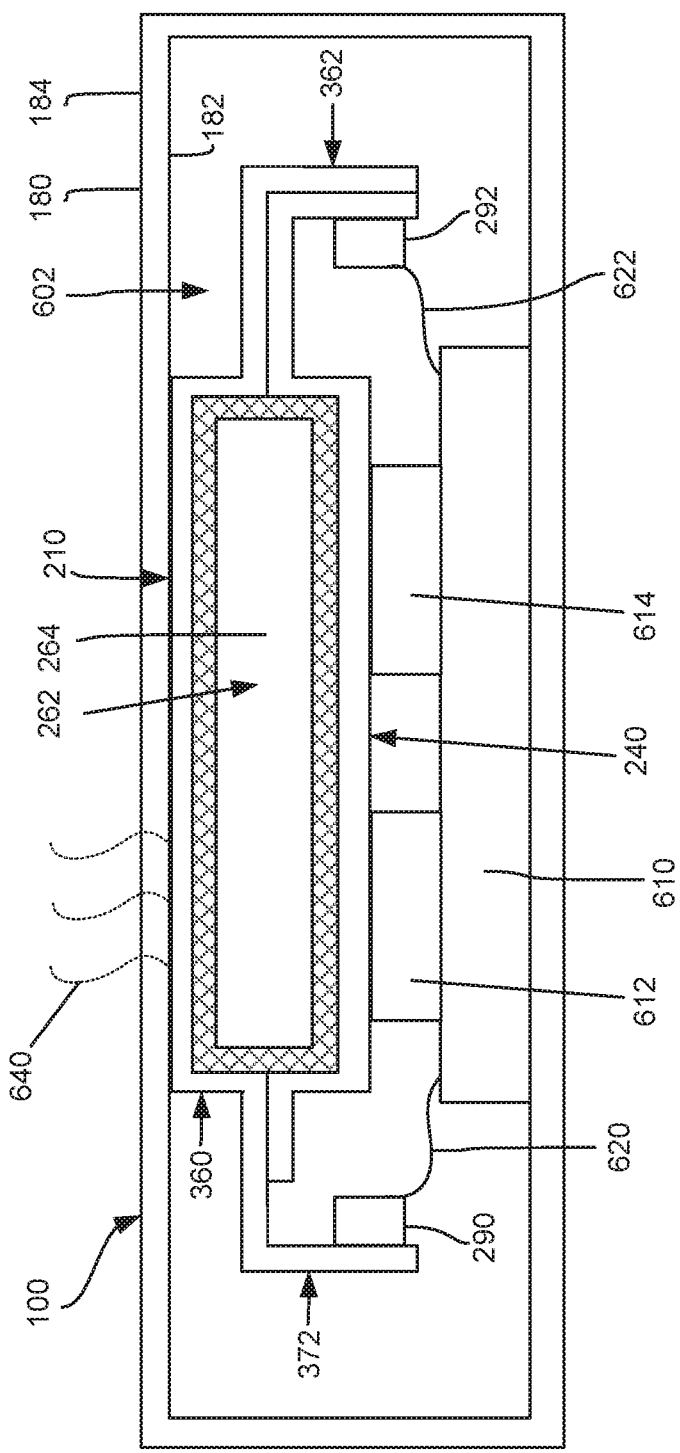
FIG. 6 is a cross-sectional view of a mobile device with an embedded heat transfer device, according to one or more embodiments.

FIG. 6 illustrates a cross sectional view of mobile device 100 having heat transfer device 360 mounted therein. Housing 180 surrounds chamber 602. Heat transfer device 360 is mounted inside chamber 602 surrounded by housing 180. A printed circuit board (PCB) 610 is also located within chamber 602 of housing 180. Electronic components 612 and 614 can be coupled or attached to PCB 610. In an embodiment, electronic component 612 can be a processor, such as processor 102 (FIG. 1). Electronic components 612 and 614 can further be coupled or attached for cooling to lower plate 240 via a conductive adhesive.

Electronic components 290 and 292 can be coupled to PCB 610 via respective flex circuit cables 620 and 622. Flex circuit cables 620 and 622 carry electrical signals between PCB 610 and electronic components 290 and 292. Electronic component 290 is attached for cooling to wing 372, which has been bent downward at an angle relative to the plane of upper plate 210. Electronic component 292 is attached for cooling to wing 362 that has been bent downward at an angle relative to the plane of upper plate 210 and lower plate 240. The bending of wings 362 and 372 allows for electronic components 290 and 292 that are positioned in different three-dimensional orientations within mobile device 100 to be coupled to heat transfer device 360. During operation, heat is transferred from electronic component 290, through wing 372, through wick 266 to thermal transfer fluid 264, through upper plate 210 and through housing 180 where heat dissipation 640 into the surrounding air occurs.

Figure 7:
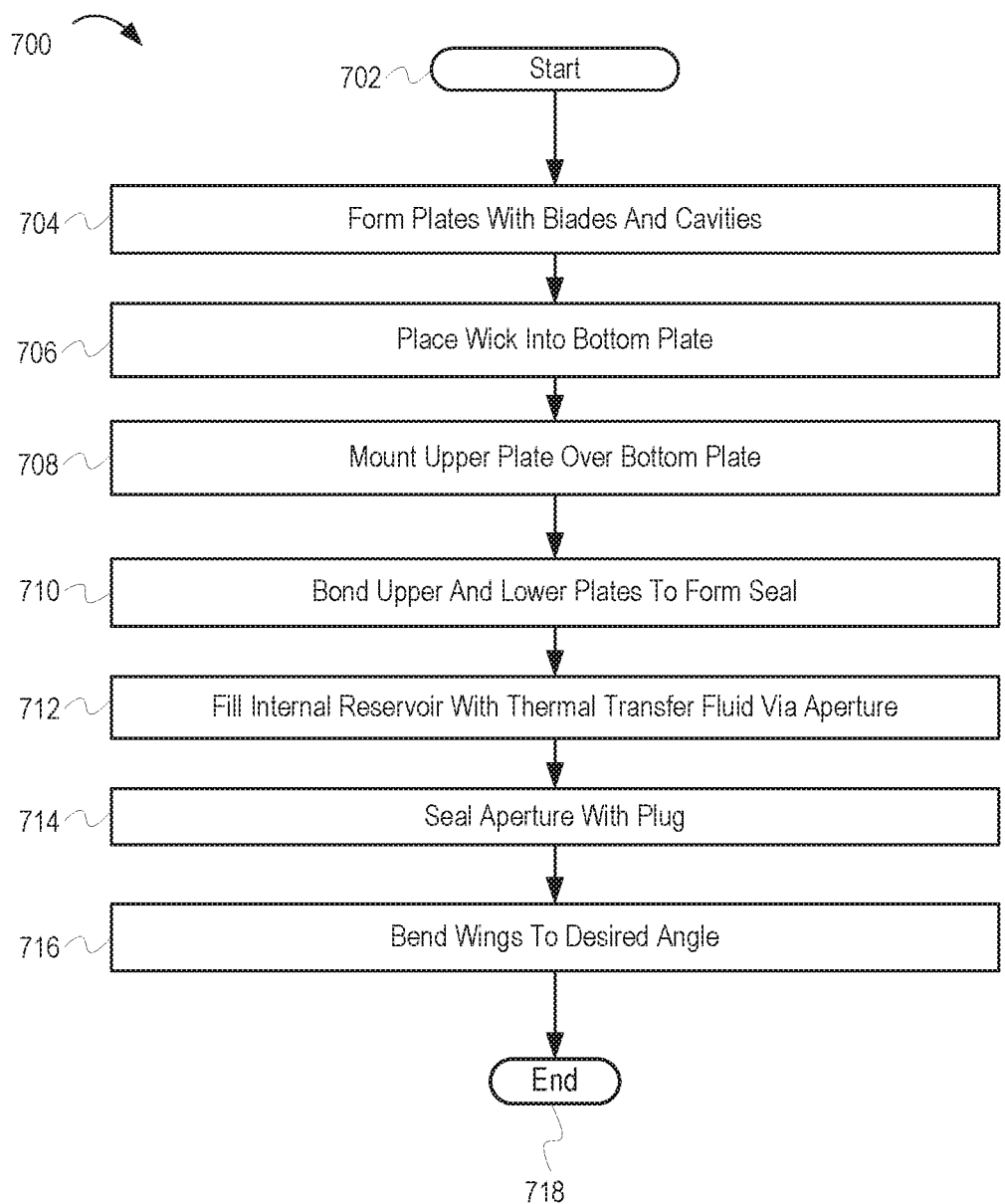
FIG. 7 is a flow chart of a method of manufacturing a heat transfer device, according to one or more embodiments.

FIG. 7 depicts a method 700 for manufacturing heat transfer device 360, according to one or more embodiments. The description of method 700 will be described with reference to the components and examples of FIGS. 1-6. The operations depicted in FIG. 7 can be performed by a processor executing program code for manufacturing a heat transfer device.

With specific reference to FIG. 7, method 700 begins at the start block 702. At block 704, upper plate 210 is formed with one or more blades 272, 282 and inner walls 227 that define cavity 226. Upper plate 210 is indented to form cavity 226. Also at block 704, lower plate 240 is formed with one or more blades 274, 284 and inner walls 257 that define cavity 256. Lower plate 240 is indented to form cavity 256. Upper plate 210 and lower plate 240 can be formed by stamping. Wick 266 is placed into lower cavity 256 of lower plate 240 (block 706). Upper plate 210 is mounted over lower plate 240 such that blades 272 and 284 are adjacent each other and blades 282 and 284 are adjacent each other (block 708). In one embodiment, blades 282 and 284 form wing 362 and blade 324 forms wing 372. The upper plate 210 is bonded to the lower plate 240 forming seal 260 (block 710). Seal 260 can be formed using various methods such as welding, brazing and adhesives.

At block 712, internal reservoir 262 is filled with thermal transfer fluid 264 through aperture 268. Aperture 268 is sealed using plug 269 (block 714). In one embodiment, wings 362 and 372 are optionally bent to a desired angle, such as 90 degrees (block 716). Method 700 ends at end block 718.

The present disclosure provides a heat transfer device that can be formed or bent into various shapes and angles to accommodate an assortment of dimensions and mounting configurations of electronic components of a mobile device.

In the above-described method of FIG. 7, one or more of the method processes may be embodied in a computer readable device containing computer readable code such that operations are performed when the computer readable code is executed on a computing device. In some implementations, certain operations of the methods may be combined, performed simultaneously, in a different order, or omitted, without deviating from the scope of the disclosure. Further, additional operations may be performed, including operations described in other methods. Thus, while the method operations are described and illustrated in a particular sequence, use of a specific sequence or operations is not meant to imply any limitations on the disclosure. Changes may be made with regards to the sequence of operations without departing from the spirit or scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object-oriented programming language, without limitation. These computer program instructions may be provided to a processor of a general-purpose computer, special-purpose computer, or other programmable data processing apparatus to produce a machine that performs the method for implementing the functions/acts specified in the flowchart and/or block diagram block or blocks. The methods are implemented when the instructions are executed via the processor of the computer or other programmable data processing apparatus.

As will be further appreciated, the processes in embodiments of the present disclosure may be implemented using any combination of software, firmware, or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device can include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

Where utilized herein, the terms "tangible" and "non-transitory" are intended to describe a computer-readable storage medium (or "memory") excluding propagating electromagnetic signals; but are not intended to otherwise limit the type of physical computer-readable storage device that is encompassed by the phrase "computer-readable medium" or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

As used herein, the term "or" is inclusive unless otherwise explicitly noted. Thus, the phrase "at least one of A, B, or C"

is satisfied by any element from the set {A, B, C} or any combination thereof, including multiples of any element.

While the disclosure has been described with reference to example embodiments, it will be understood by those skilled in the art that various changes may be made and equivalents may be substituted for elements thereof without departing from the scope of the disclosure. In addition, many modifications may be made to adapt a particular system, device, or component thereof to the teachings of the disclosure without departing from the scope thereof. Therefore, it is intended that the disclosure not be limited to the particular embodiments disclosed for carrying out this disclosure, but that the disclosure will include all embodiments falling within the scope of the appended claims.

What is claimed is:

1. A heat transfer device comprising:
a first plate having a first inner surface and a first outer surface;
a second plate having a second inner surface and a second outer surface, the first plate and the second plate spaced apart and opposed to each other and at least partially bonded such that an internal reservoir is defined between the first inner surface and the second inner surface;
a thermal transfer fluid contained within the internal reservoir and in fluid contact with both the first inner surface and the second inner surface; and
a first wing extending from a side of the first plate, the first wing separate from the internal reservoir and formed by extension of at least one blade from the side of the first plate and adapted for mounting a first electronic component that requires cooling, the first wing providing heat transfer from the first electronic component, mounted on the first wing, to the thermal transfer fluid via the first plate.

2. The heat transfer device of claim 1, wherein the first wing is bent at a first angle relative to the first plate.

3. The heat transfer device of claim 1, wherein the first electronic component is coupled to a surface of the first wing.

4. The heat transfer device of claim 1, further comprising:
a second wing extending from the second plate, the second wing adapted to be coupled to a second electronic component that requires cooling.

5. The heat transfer device of claim 4, wherein the first plate has a first side and the second plate has a second side, the first wing coupled to the first side and the second wing coupled to the second side.

6. The heat transfer device of claim 1, wherein:
the first plate has a first outer peripheral edge and the second plate has a second outer peripheral edge; and
the heat transfer device further comprises a first seal coupling the first and second plates along the first and second outer peripheral edges.

7. A heat transfer device comprising:
a first plate having a first inner surface and a first outer surface;
a second plate having a second inner surface and a second outer surface, the first plate and the second plate spaced apart and opposed to each other and at least partially bonded such that a sealed internal reservoir is defined between the first inner surface and the second inner surface;
a thermal transfer fluid contained within the internal reservoir and in fluid contact with both the first inner surface and the second inner surface;
at least one opening defined in the first plate and in the second plate and extending through the first plate and the second plate to provide at least one recess for physical insertion therein of a heat-generating electronic component; and
a first seal coupling the first plate and the second plate, the first seal surrounding the at least one opening, the at least one opening dimensioned to receive the electronic component therein; and
a second seal coupling the first plate and the second plate, the second seal surrounding the at least one recess, the at least one recess dimensioned to receive the heat-generating electronic component therein.

8. The heat transfer device of claim 7, further comprising:
the at least one recess defined in the second plate.

9. The heat transfer device of claim 1, further comprising:
a wick disposed within the internal reservoir and adjacent to the first and second inner surfaces, the wick providing a return path for condensed thermal transfer fluid.

10. The heat transfer device of claim 1, wherein the heat transfer device is mounted in a mobile device and the first electronic component is an electronic component of the mobile device.

11. A mobile device comprising:
at least one electronic component that requires cooling; and
a heat transfer device comprising:
a first plate having a first inner surface and a first outer surface;
a second plate having a second inner surface and a second outer surface, the first plate and the second plate spaced apart and opposed to each other, and at least partially bonded such that an internal reservoir is defined between the first inner surface and the second inner surface;
a thermal transfer fluid contained within the internal reservoir and in fluid contact with both the first inner surface and the second inner surface; and
a first wing extending from a side of the first plate, the first wing separate from the internal reservoir and formed by extension of at least one blade from the side of the first plate and adapted for mounting a first electronic component of the at least one electronic component that requires cooling, the first wing providing heat transfer from the first electronic component, mounted on the first wing, to the thermal transfer fluid via the first plate.

12. The mobile device of claim 11, wherein the first wing is bent at a first angle relative to the first plate.

13. The mobile device of claim 11, wherein the first electronic component is coupled to a surface of the first wing.

14. The mobile device of claim 11, further comprising:
a second wing extending from the second plate, the second wing adapted to be coupled to a second electronic component that requires cooling.

15. The mobile device of claim 14, wherein the first plate has a first side and the second plate has a second side, the first wing coupled to the first side and the second wing coupled to the second side.

16. The mobile device of claim 11, wherein:
the first plate has a first outer peripheral edge and the second plate has a second outer peripheral edge; and
the heat transfer device comprises a first seal coupling the first and second plates along the first and second outer peripheral edges.

17. A mobile device comprising:
at least one electronic component that requires cooling; and
a heat transfer device coupled to the at least one electronic component, the heat transfer device comprising:
- a first plate having a first inner surface and a first outer surface;
- a second plate having a second inner surface and a second outer surface, the first plate and the second plate spaced apart and opposed to each other, and at least partially bonded such that an internal reservoir is defined between the first inner surface and the second inner surface;
- a thermal transfer fluid contained within the internal reservoir and in fluid contact with both the first inner surface and the second inner surface;
- at least one opening defined in the first plate and in the second plate and extending through the first plate and the second plate to provide at least one recess, the at least one electronic component physically positioned within the at least one recess;
- a first seal coupling the first plate and the second plate, the first seal surrounding the at least one opening, the at least one opening dimensioned to receive a second electronic component therein; and
- a second seal coupling the first plate and the second plate, the second seal surrounding the at least one recess, the at least one recess dimensioned to receive a first electronic component among the at least one electronic component that requires cooling.

18. The mobile device of claim 17, further comprising:
the least one recess defined in the second plate.

19. The mobile device of claim 11, further comprising:
a wick disposed within the internal reservoir and adjacent to the first and second inner surfaces, the wick providing a return path for condensed thermal transfer fluid.

* * * * *